(12) United States Patent
Chen et al.

(10) Patent No.: US 8,147,010 B2
(45) Date of Patent: *Apr. 3, 2012

(54) SLIDE ASSEMBLY HAVING AN AUTOMATIC RETRACTABLE DEVICE

(75) Inventors: Ken-Ching Chen, Kaohsiung Hsien (TW); Shih-Long Huang, Kaohsiung Hsien (TW); Shun-Ho Yang, Kaohsiung Hsien (TW); Xue-Long Liu, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 549 days.

This patent is subject to a terminal disclaimer.

(21) Appl. No.: 12/352,146

(22) Filed: Jan. 12, 2009

(65) Prior Publication Data

US 2009/0115300 A1 May 7, 2009

Related U.S. Application Data

(63) Continuation-in-part of application No. 11/889,072, filed on Aug. 9, 2007, now Pat. No. 7,878,606.

(51) Int. Cl.
*A47B 95/00* (2006.01)
*A47B 88/00* (2006.01)

(52) U.S. Cl. .................................. 312/333; 312/334.44

(58) Field of Classification Search ................ 312/333, 312/334.44–334.47, 334.7; 384/21
See application file for complete search history.

(56) References Cited

U.S. PATENT DOCUMENTS

| 5,015,048 | A | 5/1991 | Brunnert |
| 5,020,868 | A | 6/1991 | Brunnert |
| 5,040,833 | A | 8/1991 | Brunnert |
| 5,040,858 | A | 8/1991 | Kruse et al. |
| 5,207,781 | A | 5/1993 | Rock |
| 5,240,318 | A | 8/1993 | Schroder et al. |
| 5,302,016 | A | 4/1994 | Lautenschlage et al. |
| 5,364,179 | A | 11/1994 | Brustle et al. |
| 5,474,375 | A | 12/1995 | Hollenstein et al. |
| 5,580,138 | A | 12/1996 | Grabher |
| 6,254,205 | B1 | 7/2001 | Wright et al. |
| 6,340,078 | B1 | 1/2002 | Scheible |
| 6,629,738 | B2 | 10/2003 | Salice |
| 6,652,050 | B2 | 11/2003 | Lin |
| 6,672,692 | B2 | 1/2004 | Weng |
| 6,712,435 | B2 | 3/2004 | Kim et al. |

(Continued)

FOREIGN PATENT DOCUMENTS

EP 0743032 B1 9/1998

(Continued)

*Primary Examiner* — Darnell Jayne
*Assistant Examiner* — Timothy M Ayres
(74) *Attorney, Agent, or Firm* — Rosenberg, Klein & Lee

(57) ABSTRACT

A slide assembly having an automatic retractable device includes a sliding member, a fixing base, a retainer, a guiding member provided on a sliding rail, and a stationary rail. The sliding rail is free to move with respect to the stationary rail. The sliding member is slidably disposed in the stationary rail. The fixing base is secured at the end of the stationary rail. The retainer is disposed in the stationary rail. The sliding member is linked to a first resilient member, which urges the sliding member back to the fixing base. An engaging plate is provided on the sliding member. The engaging plate has a first end and a second end. The first end of the engaging plate is pivotally connected to the sliding member. An engaging rod is provided on the second end of the engaging plate.

9 Claims, 20 Drawing Sheets

U.S. PATENT DOCUMENTS

| | | |
|---|---|---|
| 6,733,097 B2 | 5/2004 | Kim et al. |
| 6,736,471 B2 | 5/2004 | Lin |
| 6,799,817 B1 | 10/2004 | Chu |
| 6,846,053 B2 | 1/2005 | Salice |
| 6,848,759 B2 | 2/2005 | Doornbos et al. |
| 6,953,233 B2 | 10/2005 | Lam et al. |
| 6,971,729 B1 | 12/2005 | Kim et al. |
| 6,979,066 B2 | 12/2005 | Yang |
| 6,997,528 B2 | 2/2006 | Yang |
| 7,040,725 B1 | 5/2006 | Mao-Chin |
| 7,077,487 B2 | 7/2006 | Yang |
| 7,083,243 B2 | 8/2006 | Lee |
| 7,104,691 B2 | 9/2006 | Chi |
| 7,159,958 B1 | 1/2007 | Lu |
| 7,878,606 B2 * | 2/2011 | Chen et al. .................. 312/333 |
| 2004/0183411 A1 | 9/2004 | Boks |
| 2004/0239218 A1 | 12/2004 | Jurja |
| 2005/0104492 A1 | 5/2005 | Chiu |
| 2005/0231083 A1 | 10/2005 | Garcie |
| 2006/0017358 A1 | 1/2006 | Sato et al. |
| 2006/0043851 A1 | 3/2006 | Lee |
| 2006/0082266 A1 | 4/2006 | Le et al. |
| 2006/0108901 A1 | 5/2006 | Mao-Chin |
| 2006/0186772 A1 | 8/2006 | Lam et al. |
| 2006/0238089 A1 | 10/2006 | Prentner et al. |
| 2007/0001562 A1 | 1/2007 | Park |
| 2007/0046158 A1 | 3/2007 | Hoffman |
| 2007/0132346 A1 | 6/2007 | Huang |

FOREIGN PATENT DOCUMENTS

WO    WO 2006/038748    *    4/2006

* cited by examiner

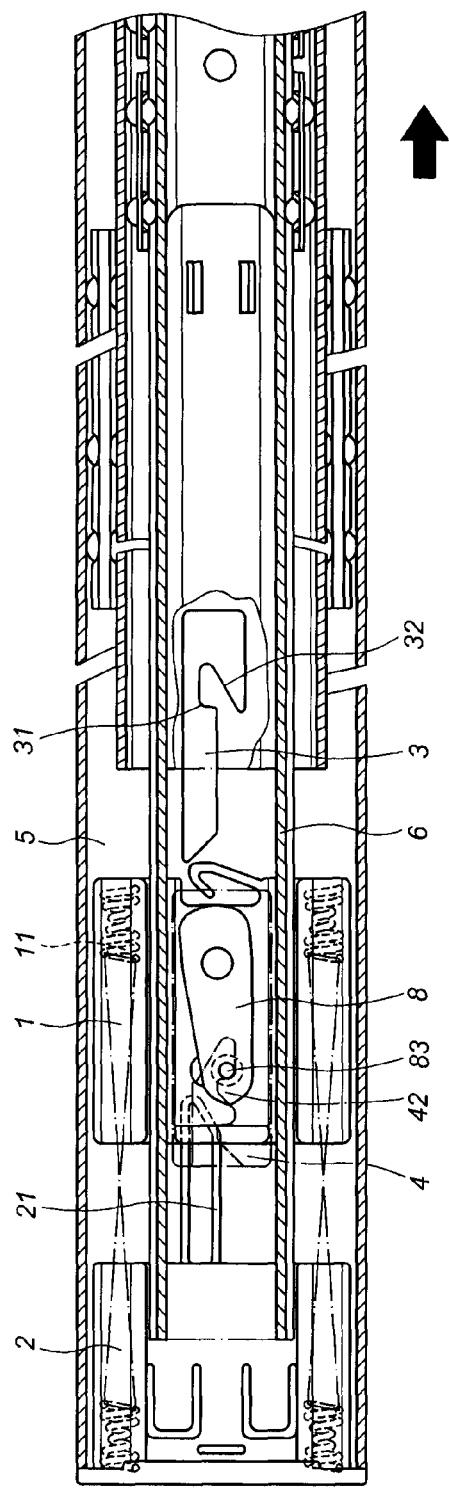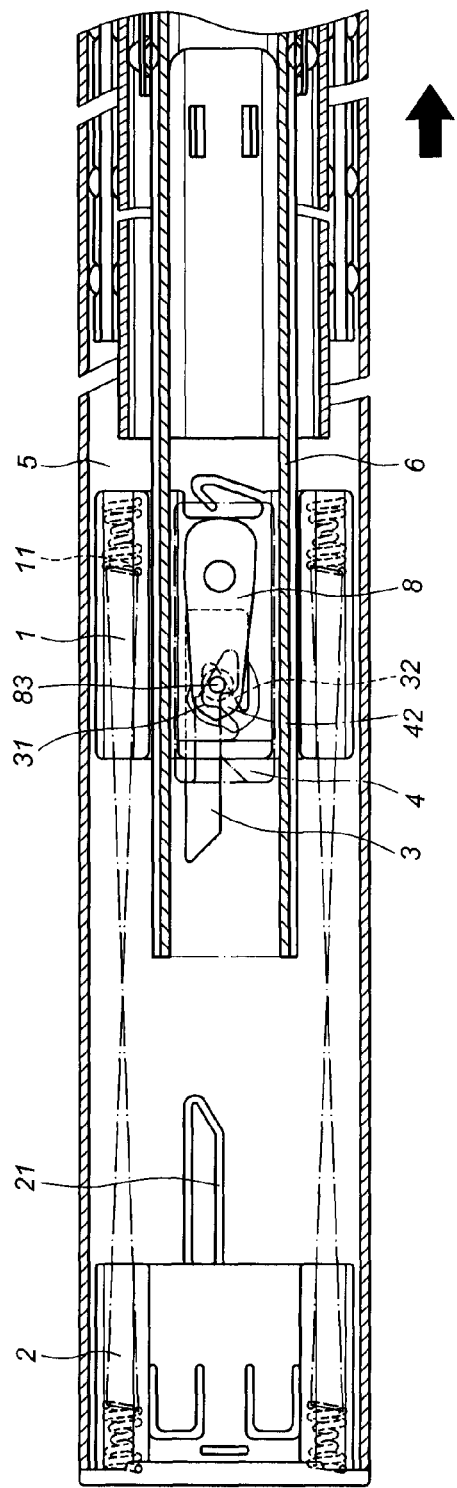

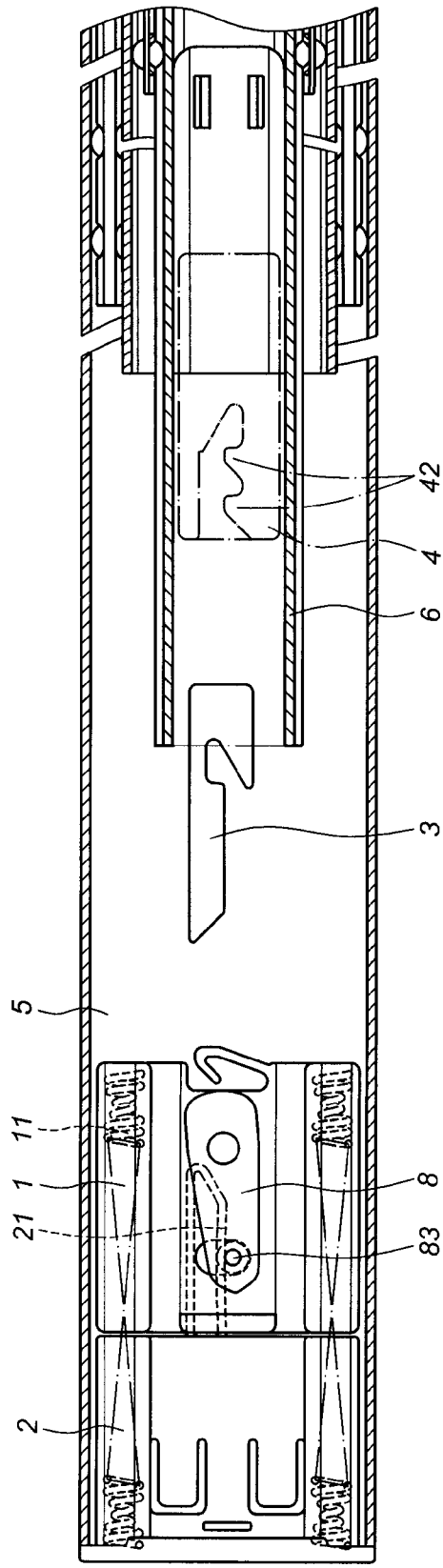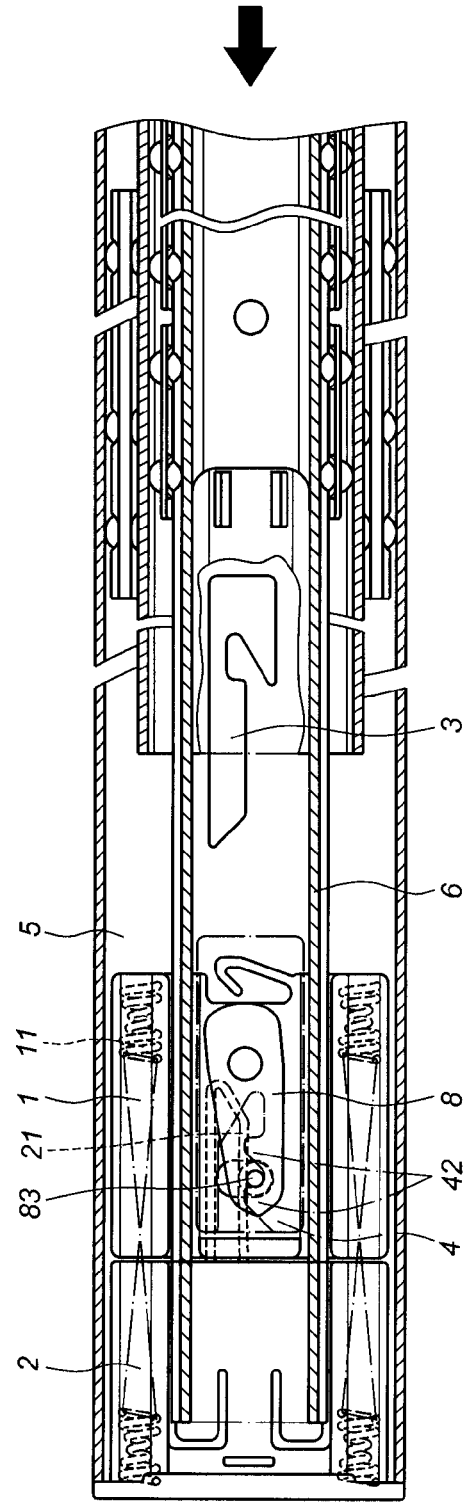

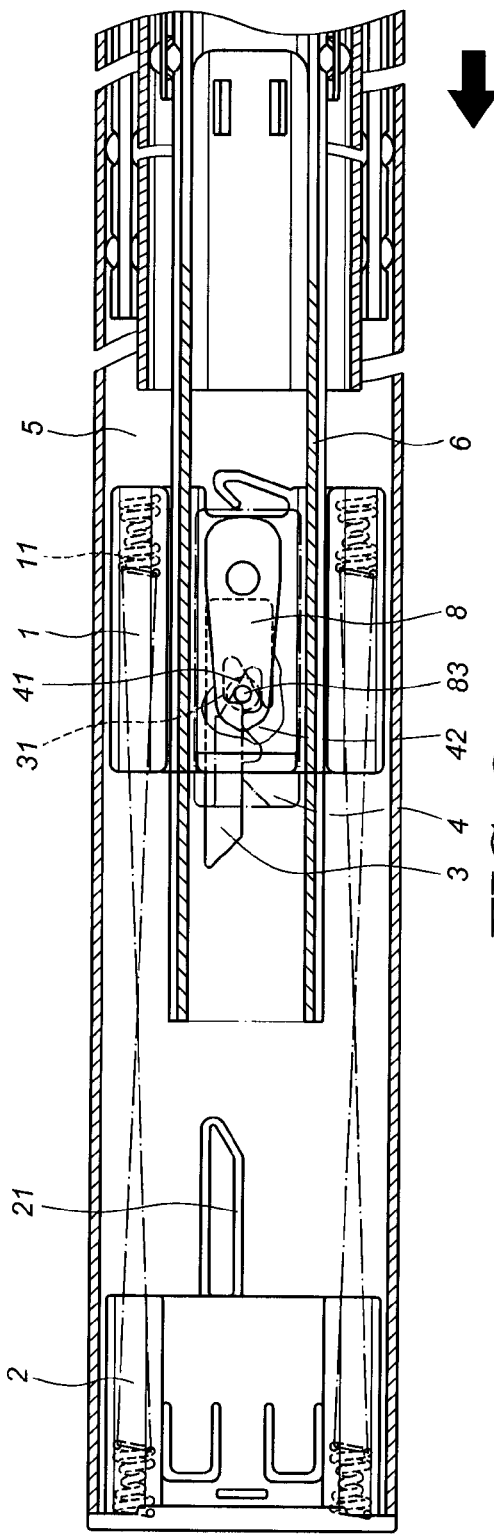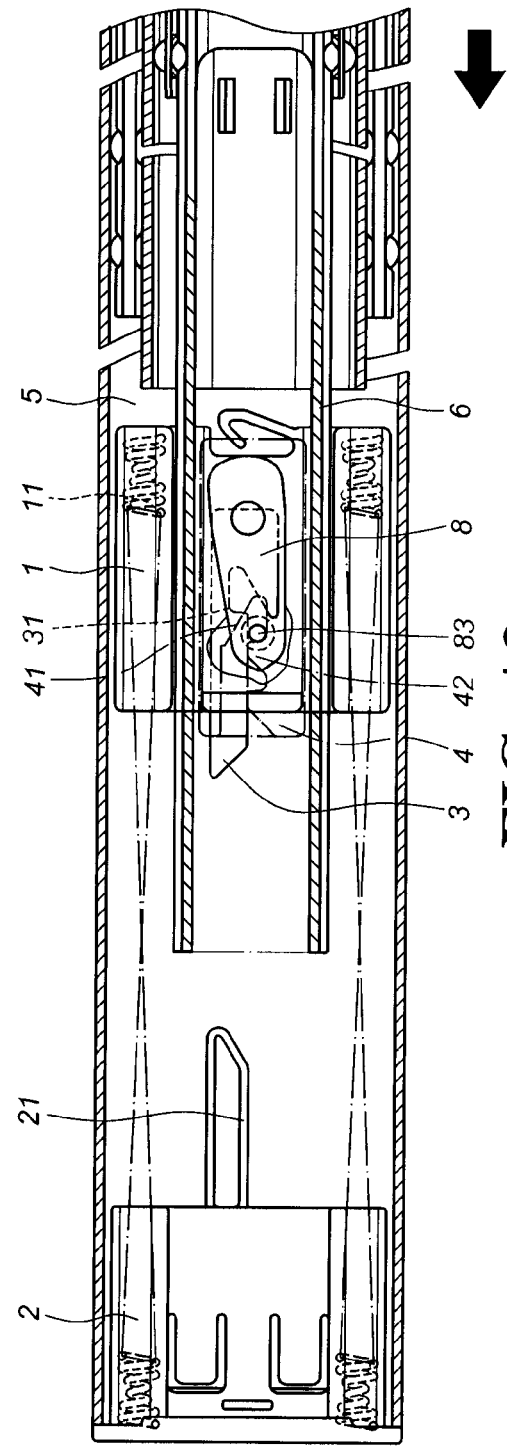

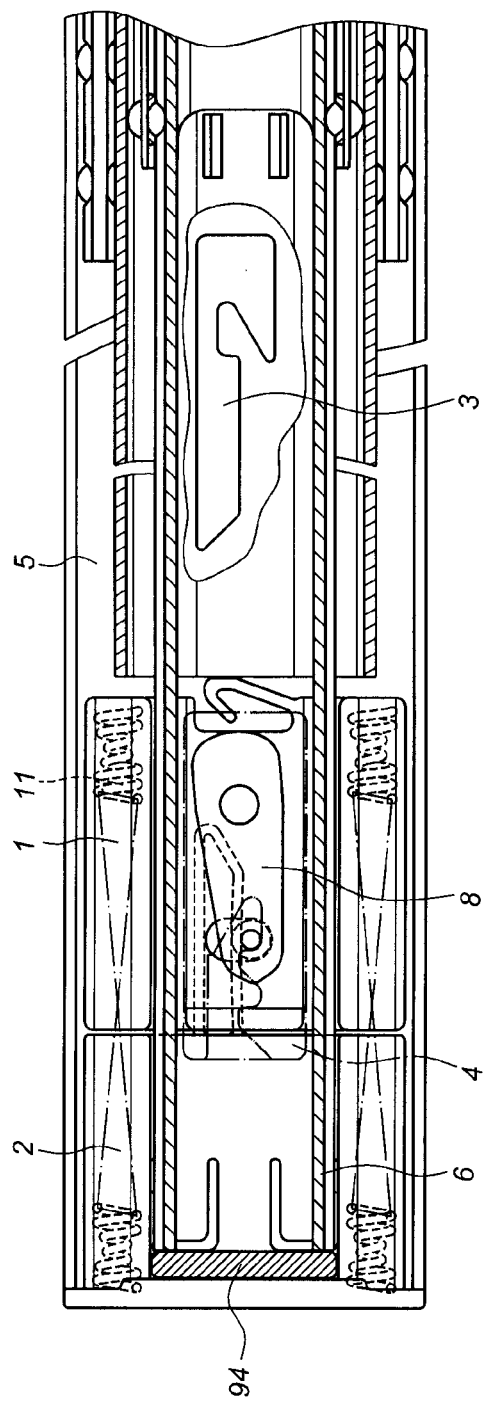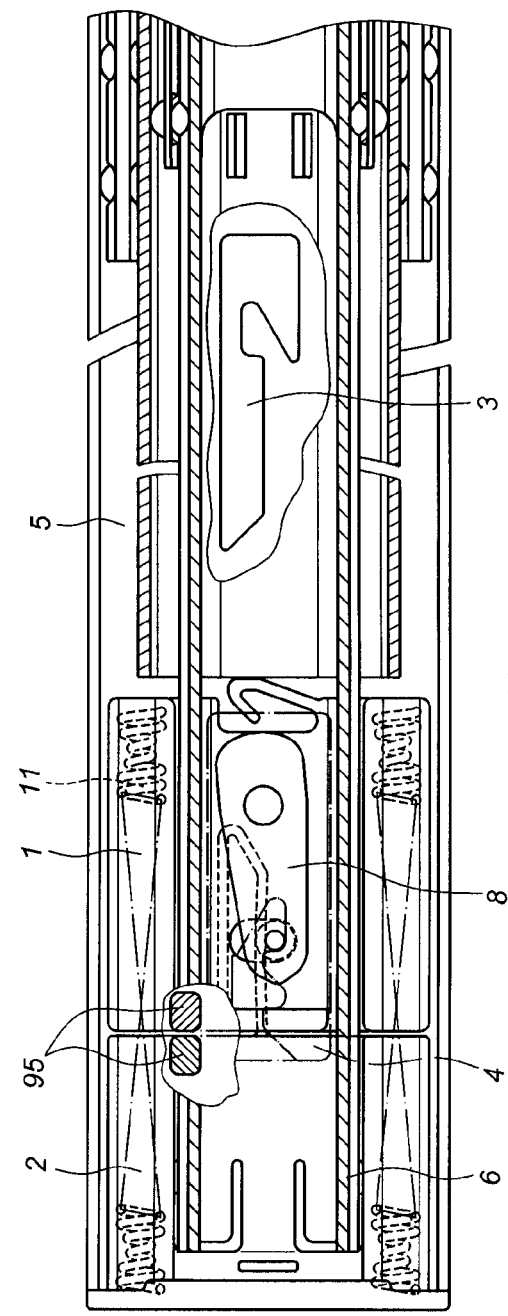

SLIDE ASSEMBLY HAVING AN AUTOMATIC RETRACTABLE DEVICE

This is a continuation-in-part application of application Ser. No. 11/889,072 filed Aug. 9, 2007, now pending.

BACKGROUND OF THE INVENTION

1. Field of the Invention

The present invention relates to a slide assembly having an automatic retractable device, and more particularly to a device which can assist a sliding member provided in a stationary rail in a slidable manner to retract to its original position automatically when a sliding rail is pushed inward.

2. Description of the Prior Art

Conventional drawers or the like use sliding rails to facilitate pulling and pushing the drawers. There are some products that provide an automatic retractable device which is to assist the drawers to back to a closed position. This function will be activated before the drawer reaching to the end.

Such designs can been found from the U.S. Pat. Nos. 5,015,048, 5,020,868, 5,040,833, 5,040,858, 5,207,781, 5,240,318, 5,302,016, 5,364,179, 5,474,375, 5,580,138, 6,254,205 B1, 6,340,078 B1, 6,629,738 B2, 6,652,050 B2, 6,672,692 B2, 6,712,435 B2, 6,733,097 B2, 6,736,471 B2, 6,799,817 B1, 6,846,053 B2, 6,848,759 B2, 6,953,233 B2, 6,971,729 B1, 6,979,066 B2, 6,997,528 B2, 7,040,725 B1, 7,077,487 B2, 7,083,243 B2, 7,104,691 B2, and 7,159,958 B1; Application Published Nos. 2004/0183411 A1, 2004/0239218 A1, 2005/0104492 A1, 2005/0231083 A1, 2006/0017358 A1, 2006/0043851 A1, 2006/0082266 A1, 2006/0108901 A1, 2006/0186772 A1, 2006/0238089 A1, 2007/0001562 A1, 2007/0046158 A1, 2007/0132346 A1; and EU Patent No. 0743032 B1.

The present invention is to improve the product to make it more solid and to lower the cost of manufacture.

SUMMARY OF THE INVENTION

The present invention provides a slide assembly having an automatic retractable device to extend the lifetime of usage by a sliding member in the stationary rail to pull a sliding rail inwardly when the sliding rail reaches to the inner end of the stationary rail.

According to the present invention, there is provided a slide assembly having an automatic retractable device, comprising:

a stationary rail having a rail trough;

a sliding rail slidably connected to said stationary rail, said sliding rail including a guiding member having a first inclined plane and a protuberance;

a sliding member slidably disposed in said rail trough of said stationary rail;

a fixing base secured at one end of said stationary rail;

a first resilient member connected between said sliding member and said fixing base;

a retainer disposed in said stationary rail, said retainer including a recess, a second inclined plane adjacent to said recess, and a second resilient member; and an engaging plate movably connected to said sliding member, said engaging plate including an engaging rod corresponding in position to said second resilient member;

wherein said engaging rod of the engaging plate is urged by the second resilient member and the engaging rod of the engaging plate engages with the protuberance of the sliding rail when the guiding member is in a first predetermined position with respect to the stationary rail;

wherein the engaging rod of the engaging plate is able to detach from the second resilient member and the engaging rod of the engaging plate moves along the second inclined plane of the retainer into the recess of the retainer when the sliding rail moves from the first predetermined position to a second predetermined position with respect to the stationary rail;

wherein said first inclined plane of said guiding member engages with said engaging rod and urges said engaging rod to detach from said recess of said retainer and then to engage with said protuberance of said guiding member when said sliding rail moves to the second predetermined position relative to said stationary rail is in, so that said sliding rail is urged by said first resilient members to retreat back into said stationary rail.

Preferably, said engaging plate has a first end pivotally connected to said sliding member and an opposite second end, and said engaging rod being disposed on said second end of said engaging plate.

Preferably, said second resilient member is integrally formed with said retainer.

Preferably, said second resilient member is a resilient rod.

It is the primary object of the present invention to provide a slide assembly having an automatic retractable device, which has a simple structure and is cost-effective.

It is another object of the present invention to provide a slide assembly having an automatic retractable device, which provides a sliding member sliding along a rail trough in a steady manner and is more reliable.

It is a further object of the present invention to provide a slide assembly having an automatic retractable device, which is more durable and has a longer lifespan.

It is still a further object of the present invention to provide a slide assembly having an automatic retractable device, which is easy to change its style to be more functioning.

BRIEF DESCRIPTION OF THE DRAWINGS

FIG. 4 is a first operational view of the first preferred embodiment of the present invention (a sliding member is linked by the guiding member);

FIG. 5 is a second operational view the first preferred embodiment of the present invention (an engaging plate reaches to a retainer);

FIG. 7 is a fourth operational view of the first preferred embodiment of the present invention (the guiding member is pulled out, but the sliding member is returned to its original position accidentally);

FIG. 8 is a fifth operational view of the first preferred embodiment of the present invention (the guiding member is pushed back and then engages with the engaging rod of the engaging plate);

FIG. 9 is a side cross-sectional view showing a retracted operation of the first preferred embodiment of the present invention (a first inclined plane of the guiding member engages with the engaging rod);

FIG. 10 is a side cross-sectional view showing a retracted operation of the first preferred embodiment of the present invention (the engaging rod engages with protuberance of the guiding member);

FIG. 17 is a cross-sectional view of the first preferred embodiment of the present invention further comprising a magnetic element (the magnetic element is a first magnetic element disposed between the fixing base and the sliding rail);

FIG. 18 is a cross-sectional view of the first preferred embodiment of the present invention further comprising a magnetic element (the magnetic element is a second magnetic element disposed between the fixing base and the sliding member);

DETAILED DESCRIPTION OF THE PREFERRED EMBODIMENTS

Figure 1:
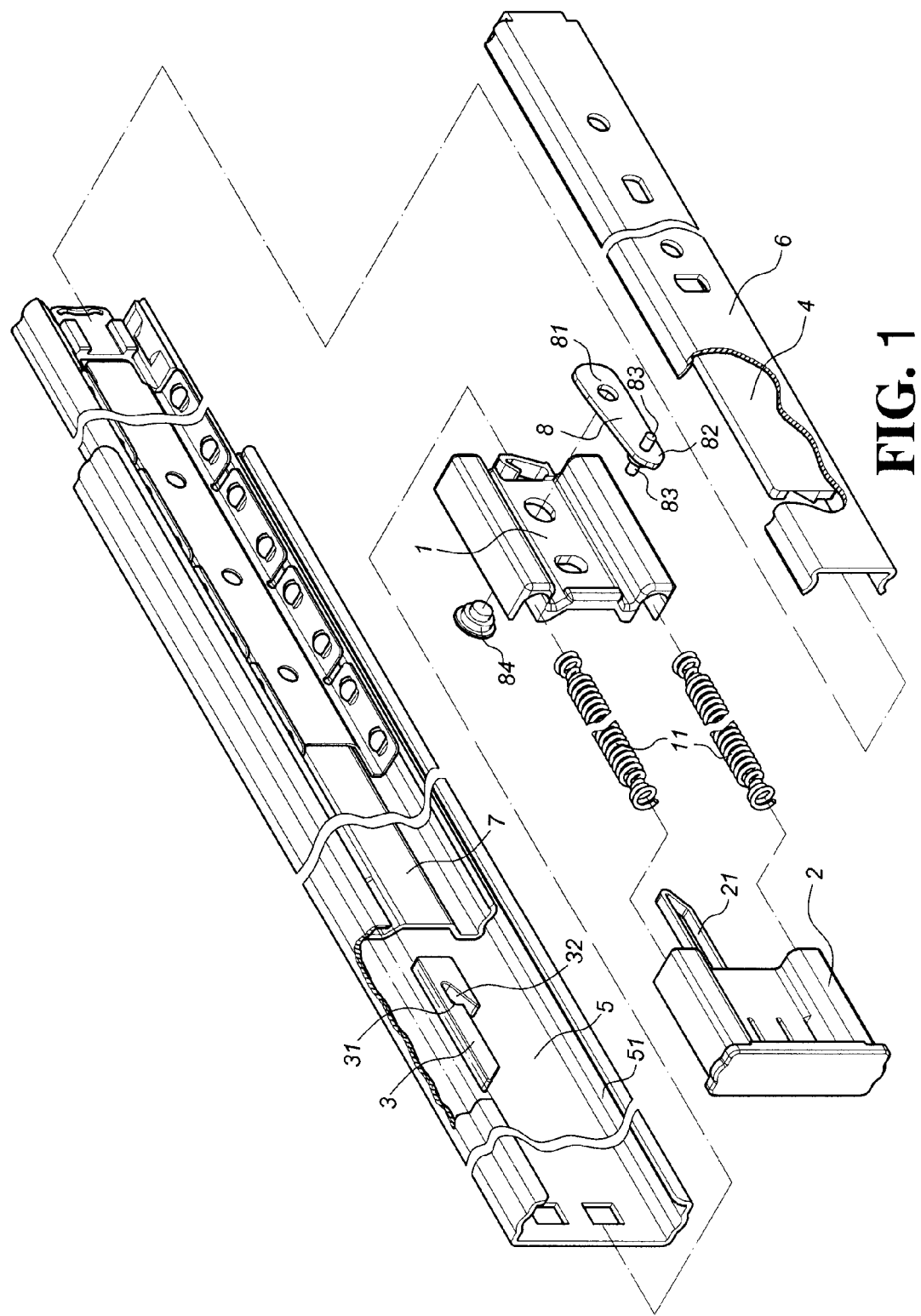
FIG. 1 is an exploded view of a first preferred embodiment of the present invention (this embodiment comprises a stationary rail, a relay rail and a sliding rail)
Figure 2:
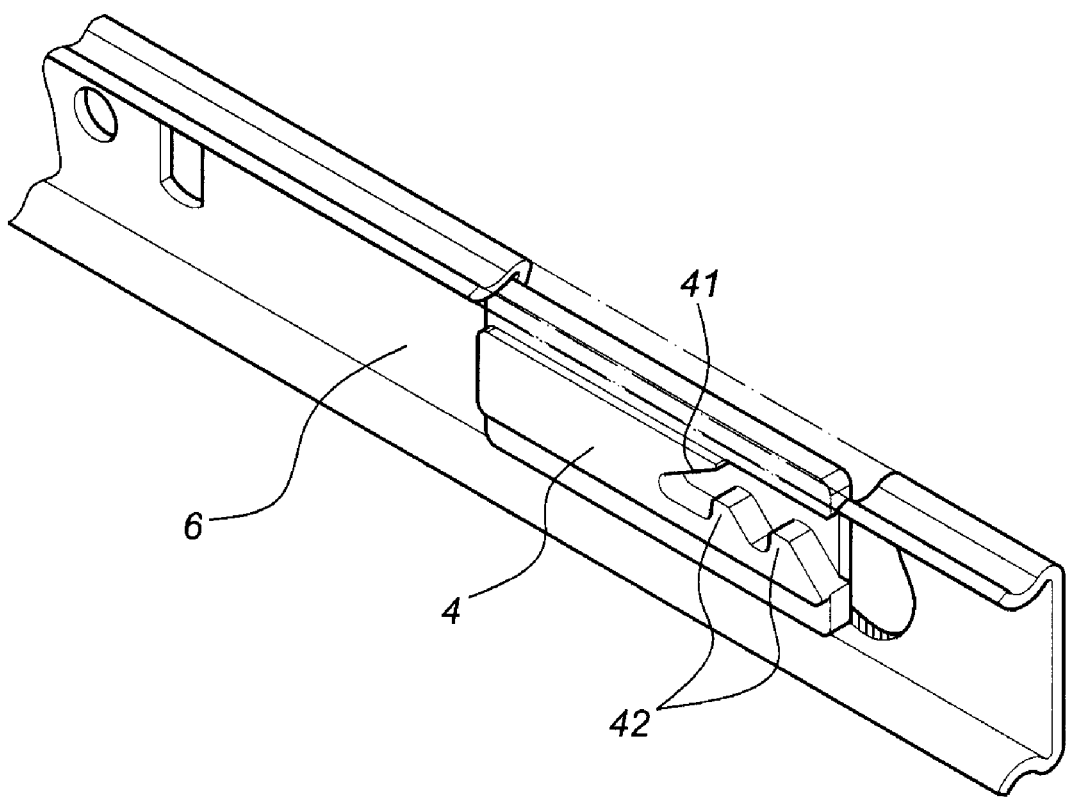
FIG. 2 is an enlarged view of a guiding member of the first preferred embodiment of the present invention.
Figure 3:
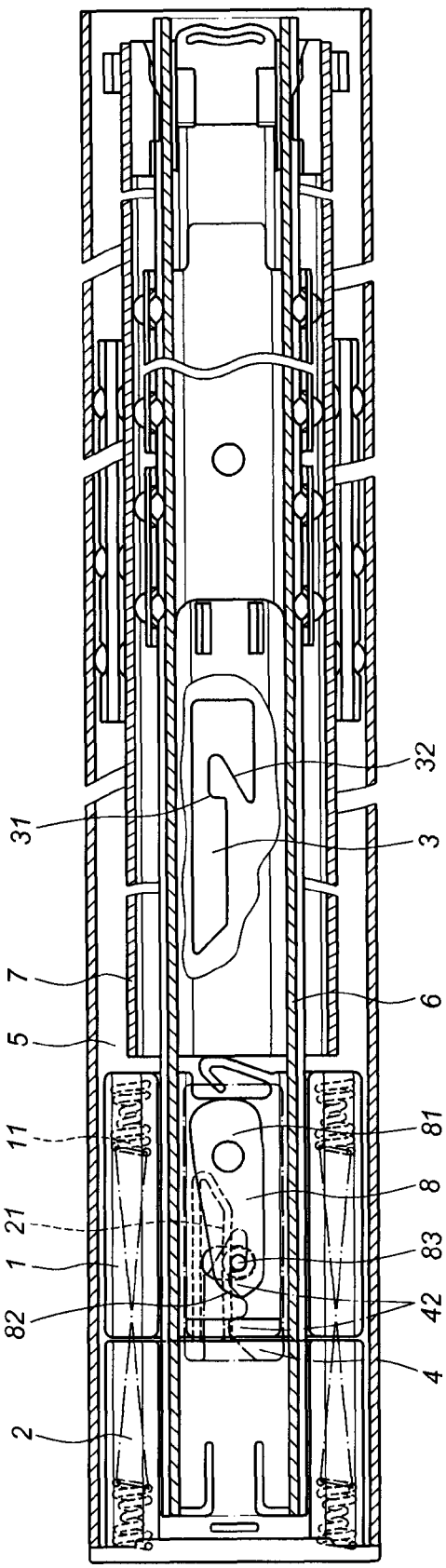
FIG. 3 is a side cross-sectional view showing the first preferred embodiment of the present invention in a fully retracted status.

As shown in FIGS. 1 through 3, a first preferred embodiment of the present invention is applied to a three-section slide assembly which is composed of a stationary rail 5, a relay rail 7 and a sliding rail 6.

The stationary rail 5 has a rail trough 51.

The sliding rail 6 is connected to the stationary rail 5 in a slidable manner. Preferably, the sliding rail 6 comprises a guiding member 4 having a first inclined plane 41 and a protuberance 42 adjacent to the first inclined plane 41.

A sliding member 1 is slidably disposed in the rail trough 51 of the stationary rail 5, and comprises a pair of first resilient members 11 and an engaging plate 8. The engaging plate 8 has a first end 81, a second end 82, an engaging rod 83, and a pivot 84. The first end 81 of the engaging plate 8 is pivotally connected to the sliding member 1 by means of the pivot 84. The engaging rod 83 is disposed on the second end 82 of the engaging plate 8.

A fixing base 2 is secured to the one end of the stationary rail 5. The fixing base 2 and the sliding member 1 are connected by the first resilient members 11.

A retainer 3 is disposed in the stationary rail 5, and comprises a recess 31 and a second inclined plane 32 adjacent to the recess 31. The second inclined plane 32 is a guide to lead the engaging rod 83 of the engaging plate 8 to slide along and to stay in the recess 31.

In a preferred embodiment of the present invention, the guiding member 4 is disposed at an inner side of the sliding rail 6, and comprises a first inclined plane 41 and a protuberance 42 for engagement of the engaging rod 83 of the engaging plate 8. Preferably, the guiding member 4 may be integrally formed with the sliding rail 6. Preferably, the guiding member 4 comprises protuberances 42.

Figure 27:
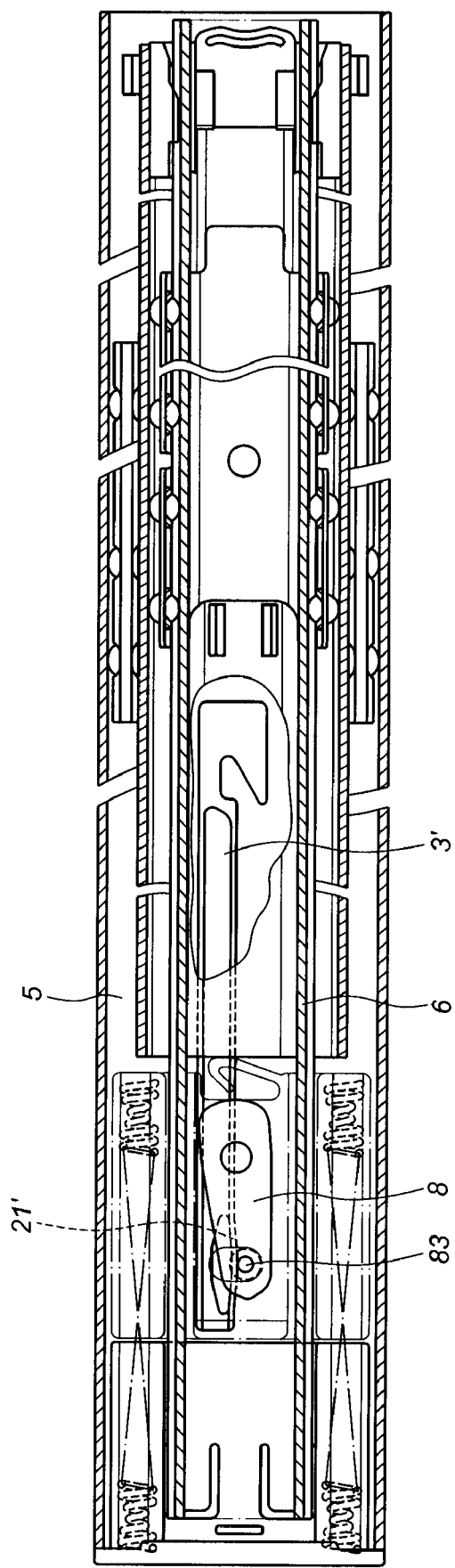
FIG. 27 is a side cross-sectional view showing that a retracted operation of the fifth preferred embodiment of the present invention (the retainer comprises a second resilient member for engaging with the engaging rod)

The engaging rod 83 of the engaging plate 8 provides a locked and released function in connection with the guiding member 4 of the sliding rail 6 and the retainer 3 of the stationary rail 5. A second resilient member 21 integrally formed with the fixing base 2 will urge the engaging plate 8 to deviate when the sliding member 1 is pulled back towards the fixing base 2 by the first resilient members 11. In a preferred embodiment of the present invention, a second resilient member 21' is integrally formed with a retainer 3', as shown in FIG. 27. Preferably, the second resilient member 21' is a resilient rod.

FIGS. 3 through 6 show the operation of the present invention. FIG. 3 shows the slide assembly is in a retracted position. When the sliding member 1 is returned to the fixing base 2, the engaging rod 83 of the engaging plate 8 is urged by the second resilient member 21 of the fixing base 2 while the protuberance 42 of the guiding member 4 in the sliding rail 6 engage with the engaging rod 83 of the engaging plate 8. The guiding member 4 and the sliding member 1 are connected by the engagement of the engaging plate 8. The first resilient members 11 provide a pulling force against the sliding member 1 to force the sliding member 1 to retract into the stationary rail 5 and to secure thereat.

As shown in FIG. 4, the sliding rail 6 is pulled outwardly in relation to the stationary rail 5. The sliding member 1 is linked to slide outwardly by the guiding member 4 through the engaging plate 8. The engaging rod 83 of the engaging plate 8 disengages from the second resilient member 21 of the fixing base 2.

As shown in FIG. 5, when the sliding rail 6 is further pulled in relation to the stationary rail 5, the engaging rod 83 of the engaging plate 8 will engage with the second inclined plane 32 of the retainer 3, which guides the engaging rod 83 into the recess 31 of the retainer 3.

Figure 6:
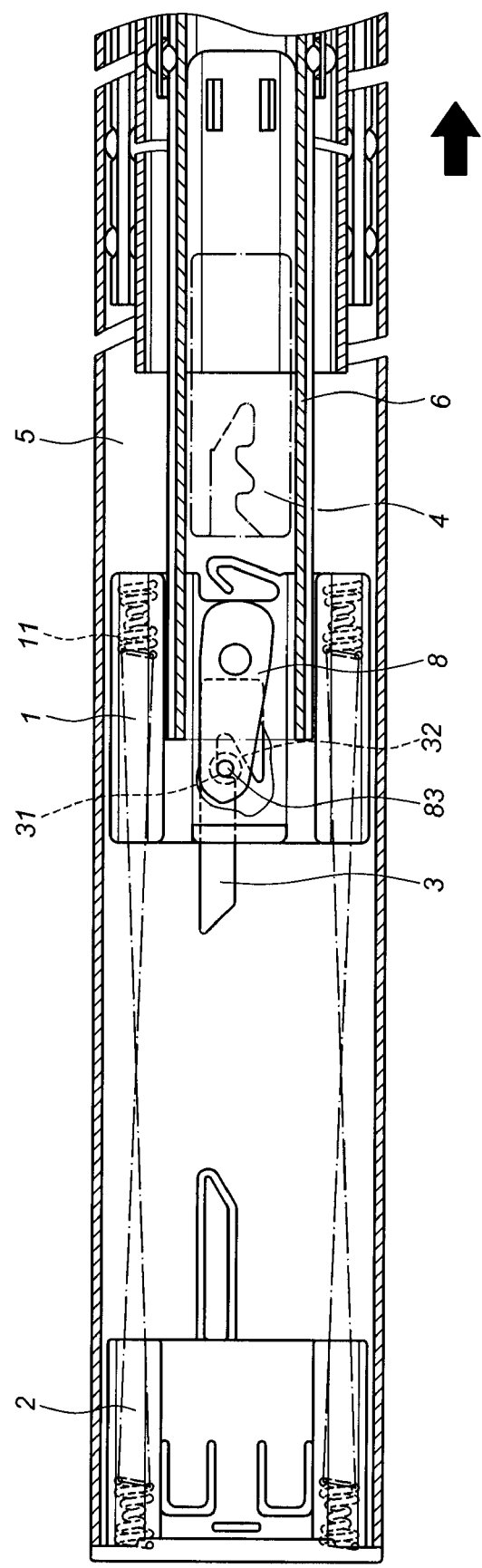
FIG. 6 is a third operational view of the first preferred embodiment of the present invention (an engaging rod of the engaging plate engages with a recess of the retainer, and the guiding member disengages from the sliding member)

As shown in FIG. 6, when the sliding rail 6 is continually pulled, the engaging rod 83 of the engaging plate 8 is located in the recess 31 to confine the sliding member 1 to stop in the retainer 3, and the protuberance 42 of the guiding member 4 disengage from the engaging rod 83 so that the guiding member 4 is linked by the sliding rail 6 to slide.

In case the sliding member 1 does not be stopped by the retainer 3, such as the sliding member 1 is pulled by the first resilient members 11 to return to the fixing base 2 and the engaging rod 83 is urged by the second resilient member 21 at the front of the fixing base 2, as shown in FIG. 7. In order to solve these problems, the user may push the sliding rail 6 back to its original position (or to keep the sliding rail 6 at current position and return the sliding rail 6 back to its original position after the job is done), hence the protuberances 42 will be forced to override and engage with the engaging rod 83 because the second resilient member 21 provides a deviating force to the engaging plate 8, as shown in FIG. 8.

As shown in FIG. 9, the sliding rail 6 is pushed inward. When the guiding member 4 reaches to the sliding member 1, the first inclined plane 41 of the guiding member 4 will engage with the engaging rod 83. This engagement will urge the engaging rod 83 to detach from the recess 31 of the retainer 3 and then to engage with the protuberance 42 of the guiding member 4, as shown in FIG. 10. The sliding member 1 is detached from the retainer 3 and the sliding rail 6 is urged by the first resilient members 11 to retreat back into the stationary rail 5.

Figure 11:
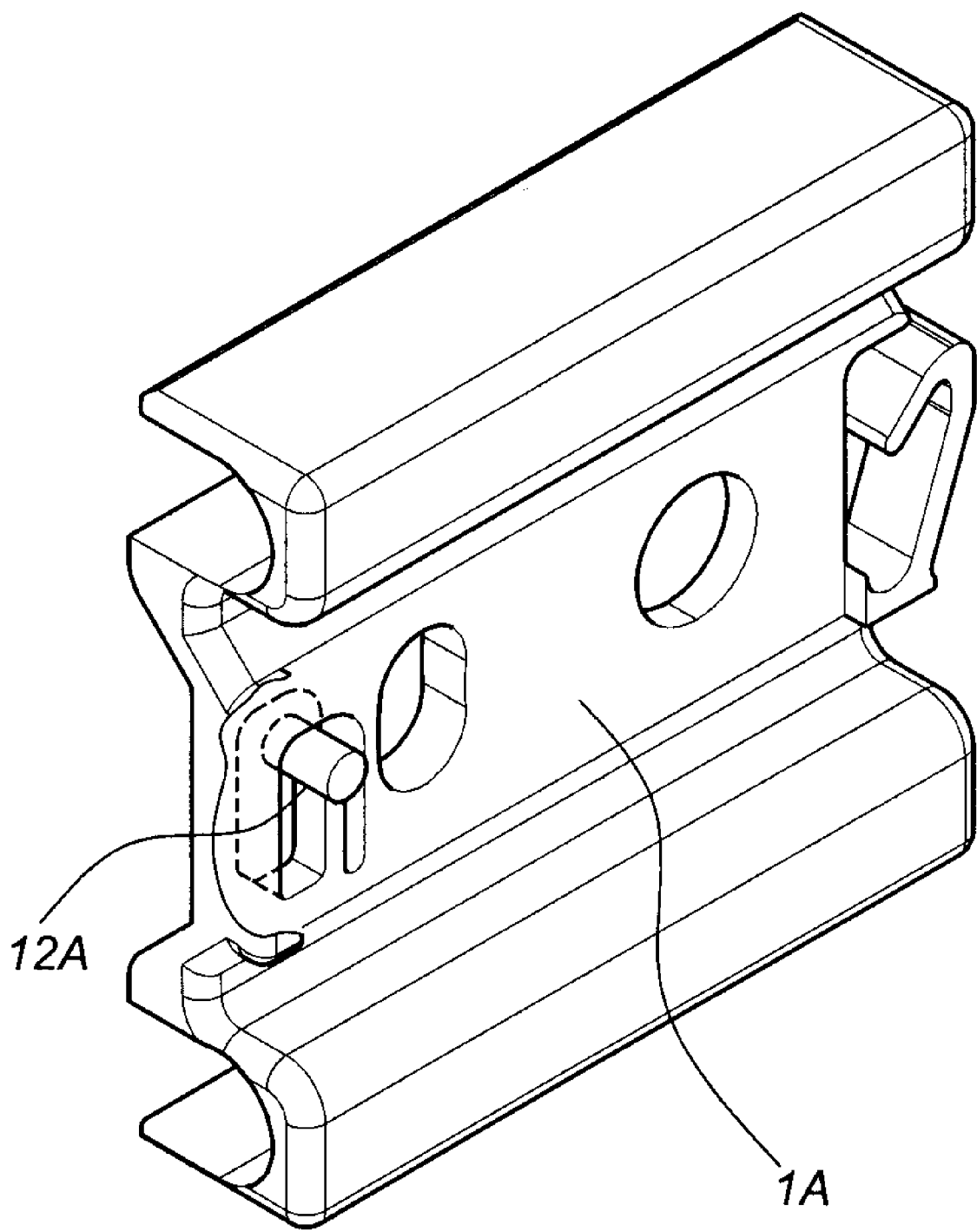
FIG. 11 is a perspective view of a sliding member of the a second preferred embodiment of the present invention.
Figure 12:
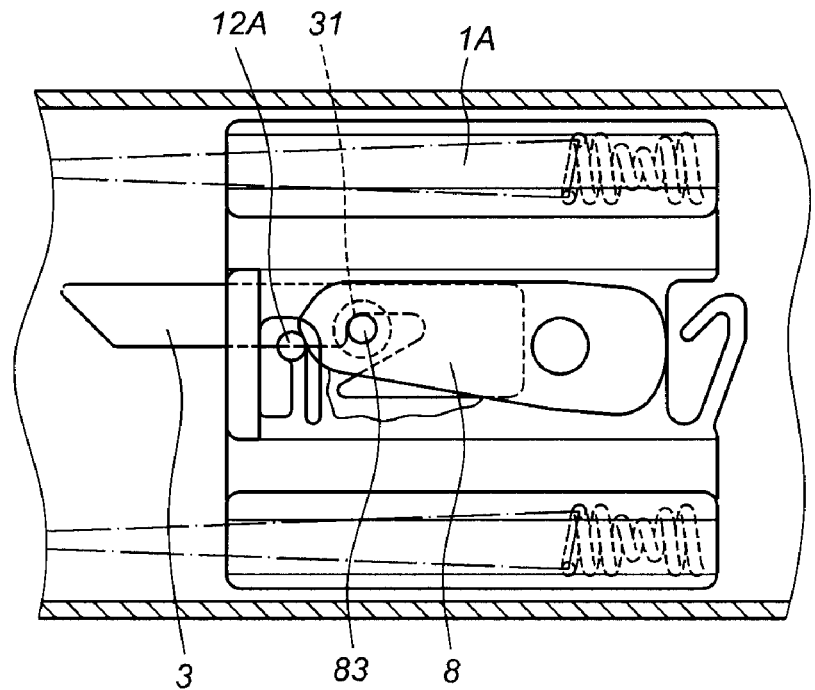
FIG. 12 is a cross-sectional view of the second preferred embodiment of the present invention showing the sliding member and the engaging plate in a positioned status (with the second end of the engaging plate facing upward)
Figure 13:
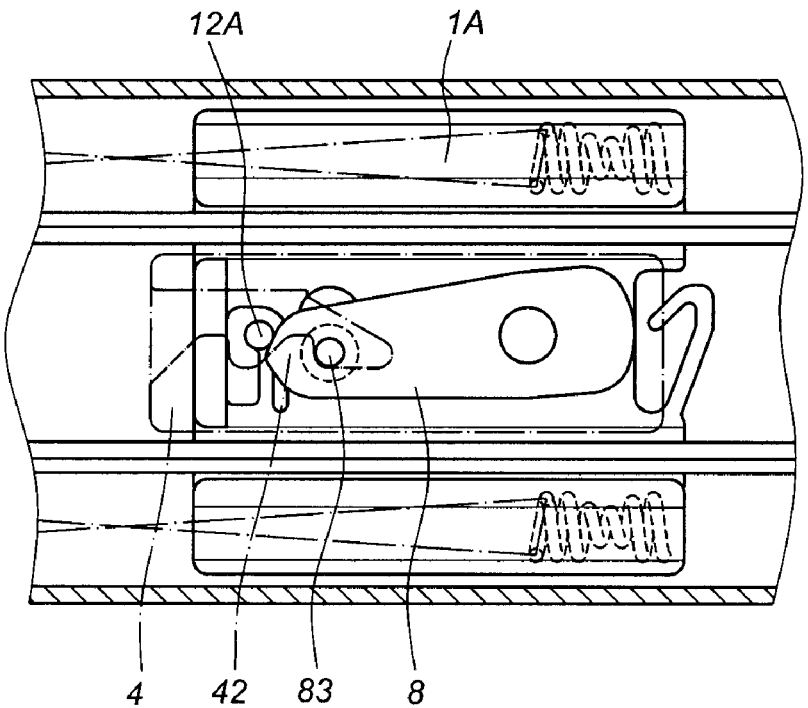
FIG. 13 is a cross-sectional view of the second preferred embodiment of the present invention showing the sliding member and the engaging plate in a positioned status (with the second end of the engaging plate facing downward)

FIGS. 11, 12 and 13 show a sliding member 1A of a second preferred embodiment of the present invention which comprises a stopper 12A. The second end 82 of the engaging plate 8 is able to swing and blocked by the stopper 12A at two different locations. One location of the second end 82, as shown in FIG. 12, is in an upper position relative to the stopper 12A. The engaging rod 83 engages with the recess 31 of the retainer 3. The other position of the second end 82 is in a lower position relative to the stopper 12A, as shown in FIG. 13. The engaging rod 83 engages with the protuberance 42 of the guiding member 4.

Figure 14:
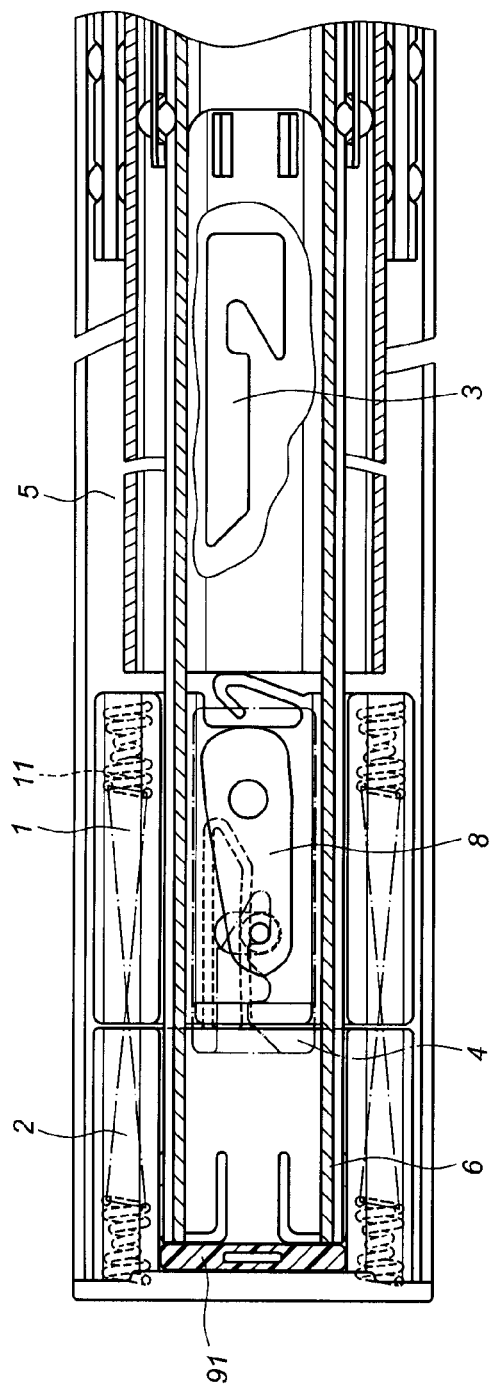
FIG. 14 is a cross-sectional view of the first preferred embodiment of the present invention further comprising a buffer (the buffer is a first resilient member disposed between the fixing base and the sliding rail)
Figure 15:
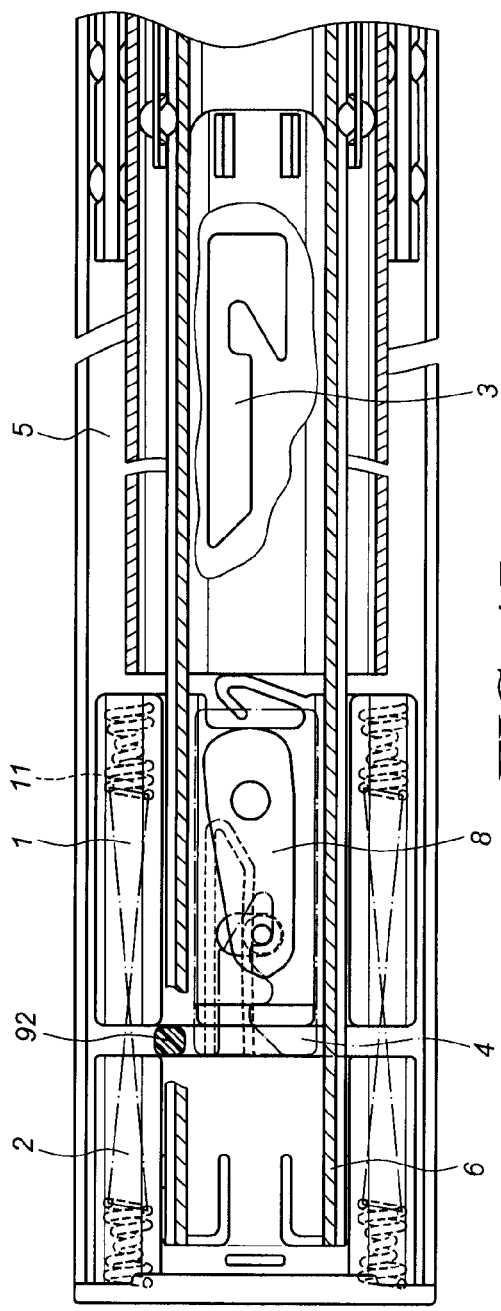
FIG. 15 is a cross-sectional view of the first preferred embodiment of the present invention further comprising a buffer (the buffer is a second resilient member disposed between the fixing base and the sliding member)
Figure 16:
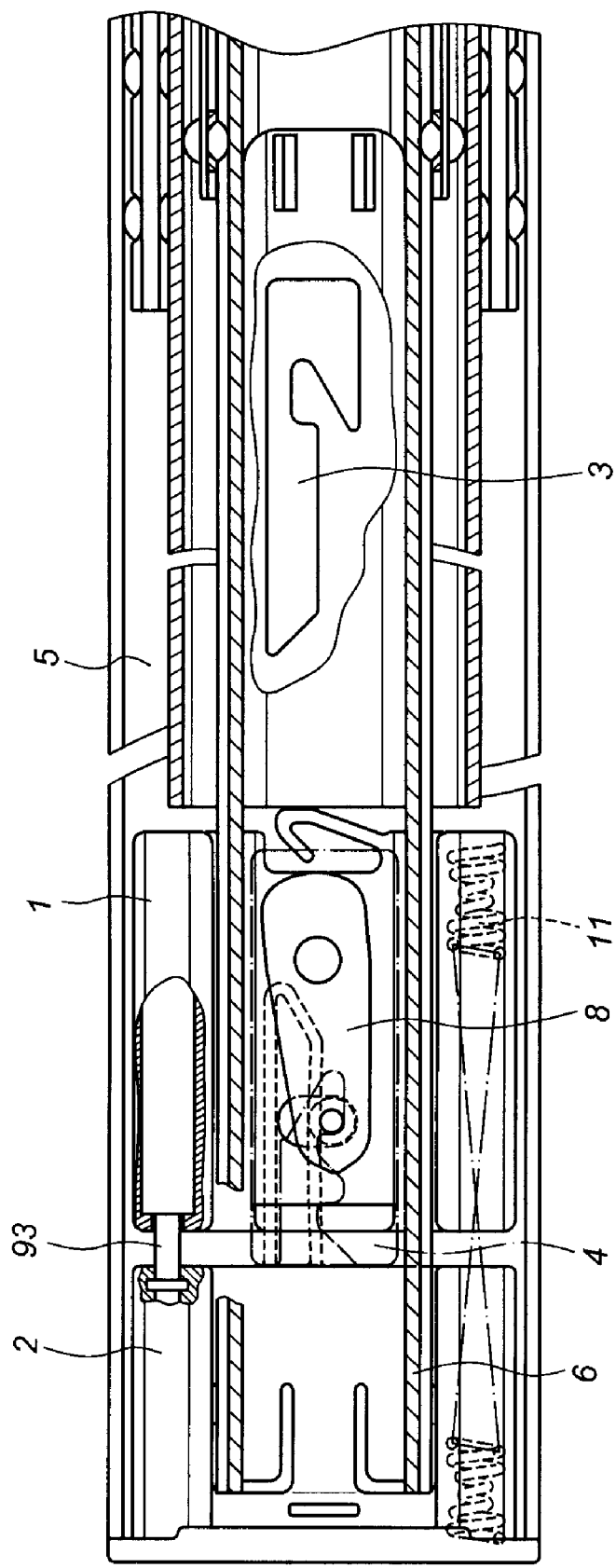
FIG. 16 is a cross-sectional view of the first preferred embodiment of the present invention further comprising a buffer (the buffer is a pneumatic or a hydraulic type stick)

As shown in FIGS. 14 through 16, the present invention further comprises a buffer to slow down the striking force of the sliding rail 6 when collapsing and the noise as well. As shown in FIG. 14, a first resilient member 91 is provided between the fixing base 2 and the sliding rail 6. As shown in FIG. 15, a second resilient member 92 is provided between the fixing base 2 and the sliding member 1. As shown in FIG. 16, a pneumatic or a hydraulic buffer stick 93 is provided between the fixing base 2 and the sliding member 1.

The present invention further comprises a magnetic element to secure the sliding rail 6 in a retracted position. As shown FIG. 17, a first magnetic element 94 is provided between the fixing base 2 and the sliding rail 6 to secure the sliding rail 6 made of metallic material. As shown in FIG. 18, second magnetic elements 95 are provided between the fixing base 2 and the sliding member 1. The magnetic elements 95 are fixed on relative ends of the fixing base 2 and the sliding member 1.

Figure 19:
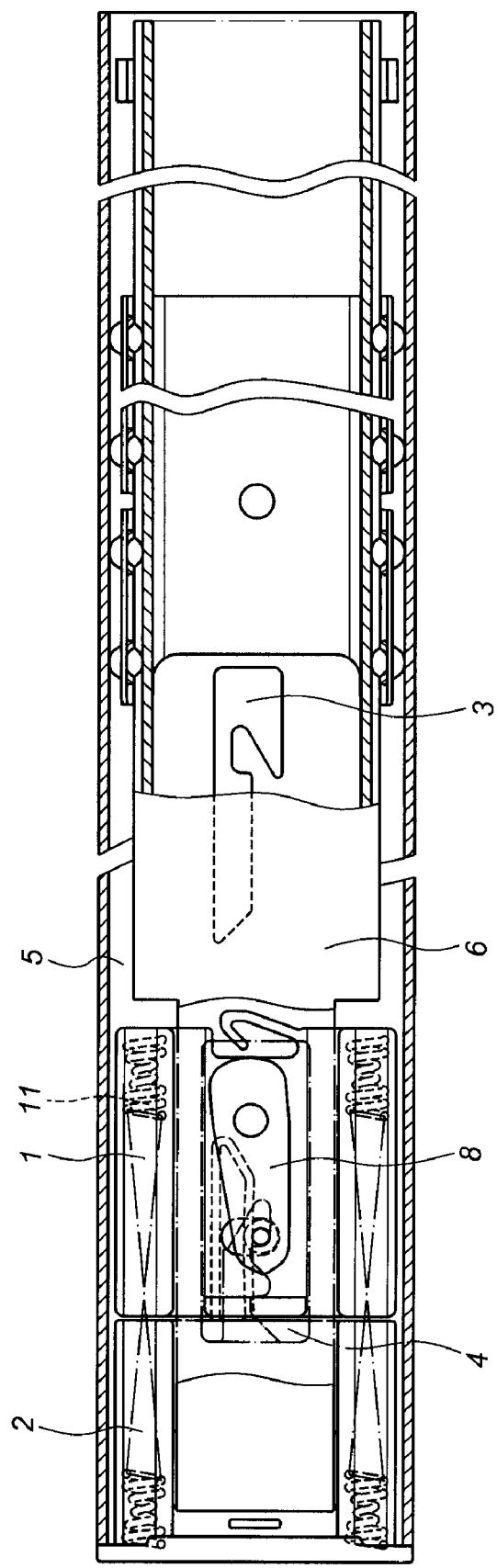
FIG. 19 is a cross-sectional view of a third preferred embodiment of the present invention applied to a two-section slide assembly composed of a stationary rail and a sliding rail.

The above description mainly emphasizes a three-section slide assembly having the relay rail 7 between the stationary rail 5 and the sliding rail 6. As shown in FIG. 19, the present invention may be applied to a two-section slide assembly composed of the sliding rail 6 and the stationary rail 5.

Figure 20:
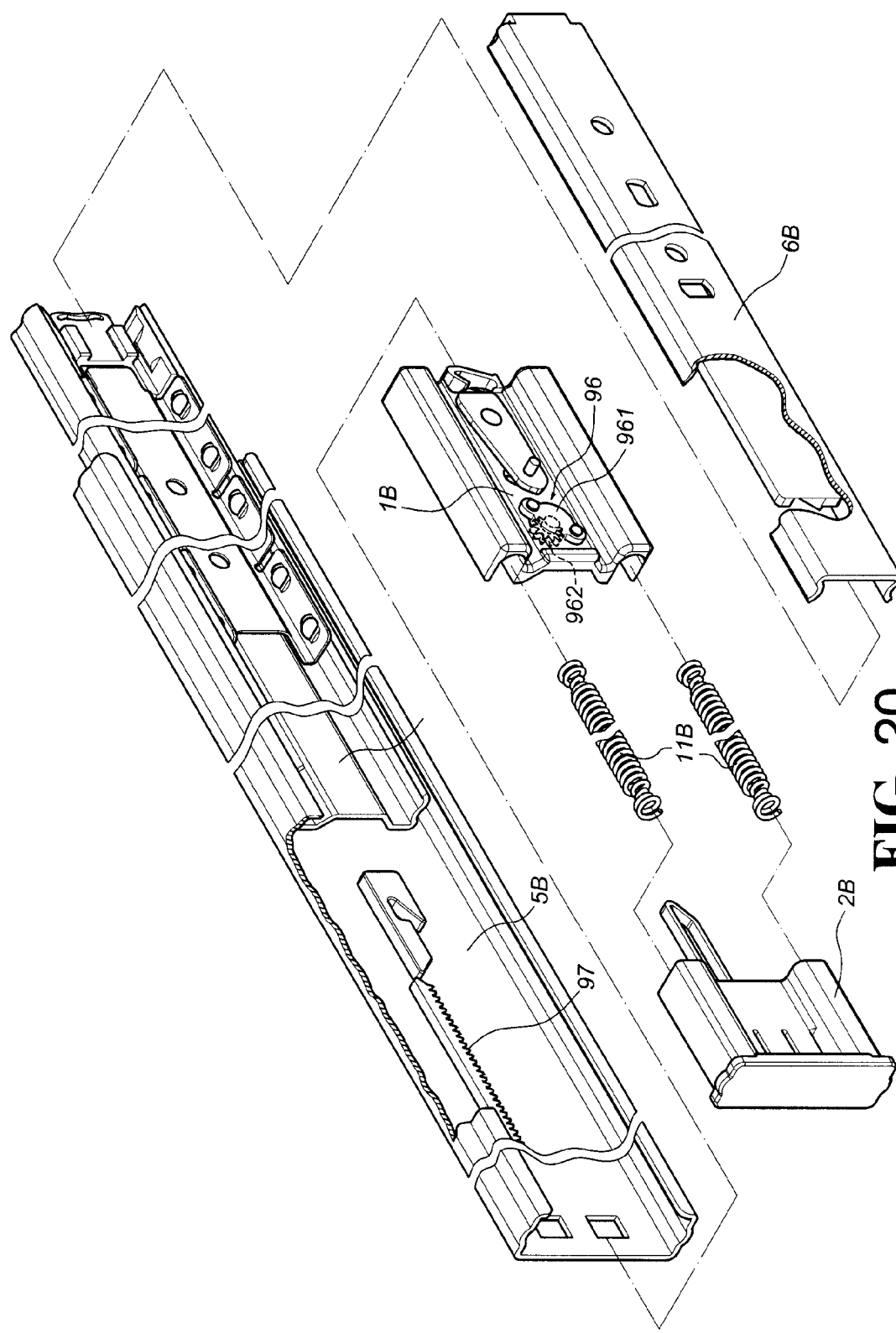
FIG. 20 is an exploded view of the first preferred embodiment of the present invention further comprising a damper and a gear chain.
Figure 21:
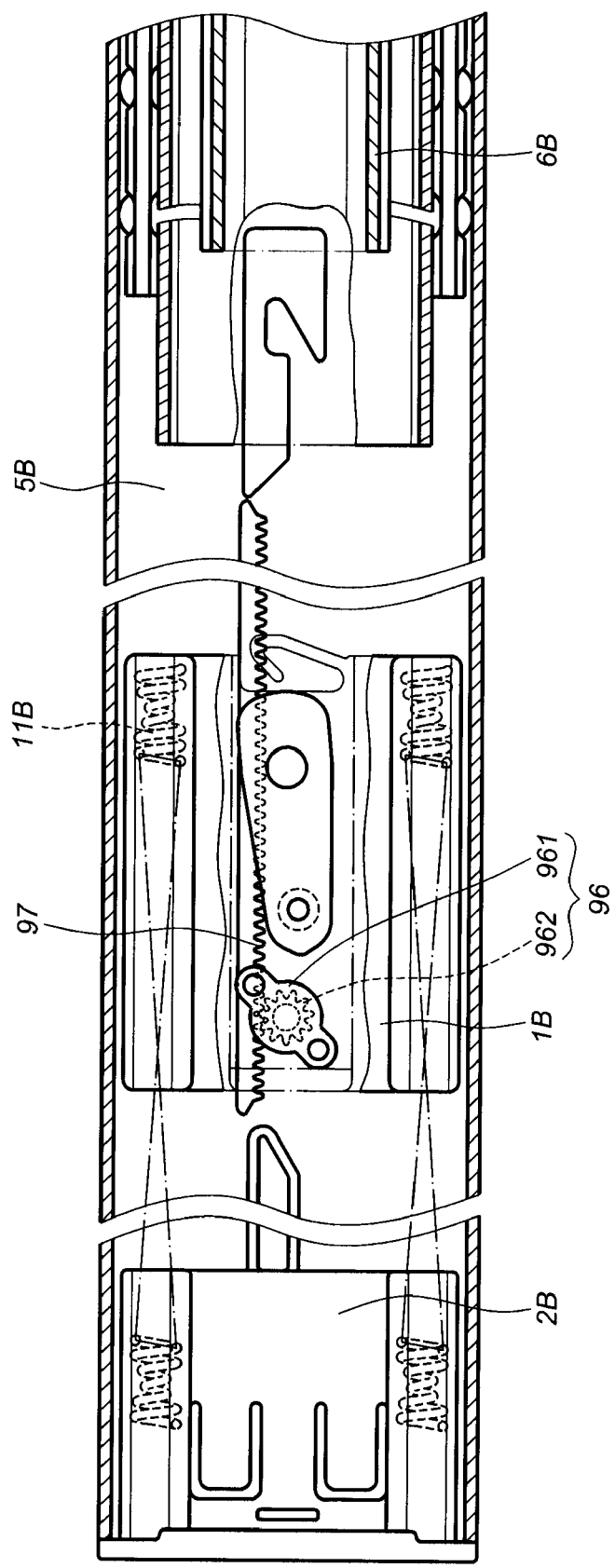
FIG. 21 is a side cross-sectional view of the first preferred embodiment of the present invention showing the assembly of the damper and the gear chain.

As shown in FIGS. 20 and 21, the present invention further comprises a damper 96 disposed on a sliding member 1B as a friction when collapsing the sliding rail 6. The damper 96 comprises a case 961 and a gear 962. The case 961 is secured on the sliding member 1B. A gear chain 97 is secured in the stationary rail 5B for meshing with the gear 962. The stationary rail 5B comprises a fixing base 2B at a rear end thereof. The fixing base 2B and the sliding member 1B are connected by first resilient members 11B.

Figure 22:
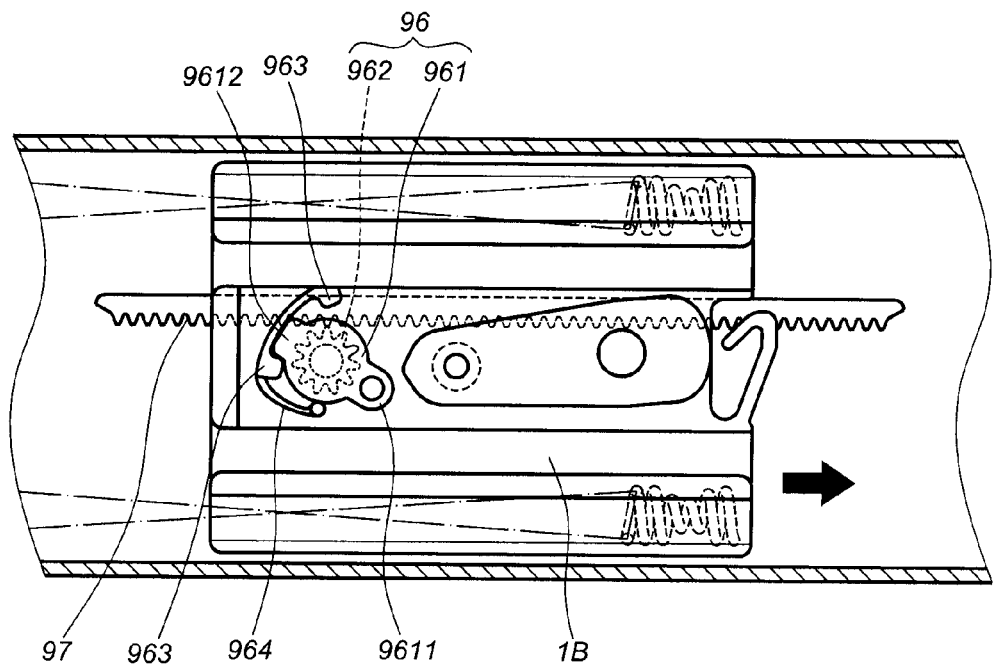
FIG. 22 is a side cross-sectional view of the first preferred embodiment of the present invention showing that the damper disengages from the gear chain.
Figure 23:
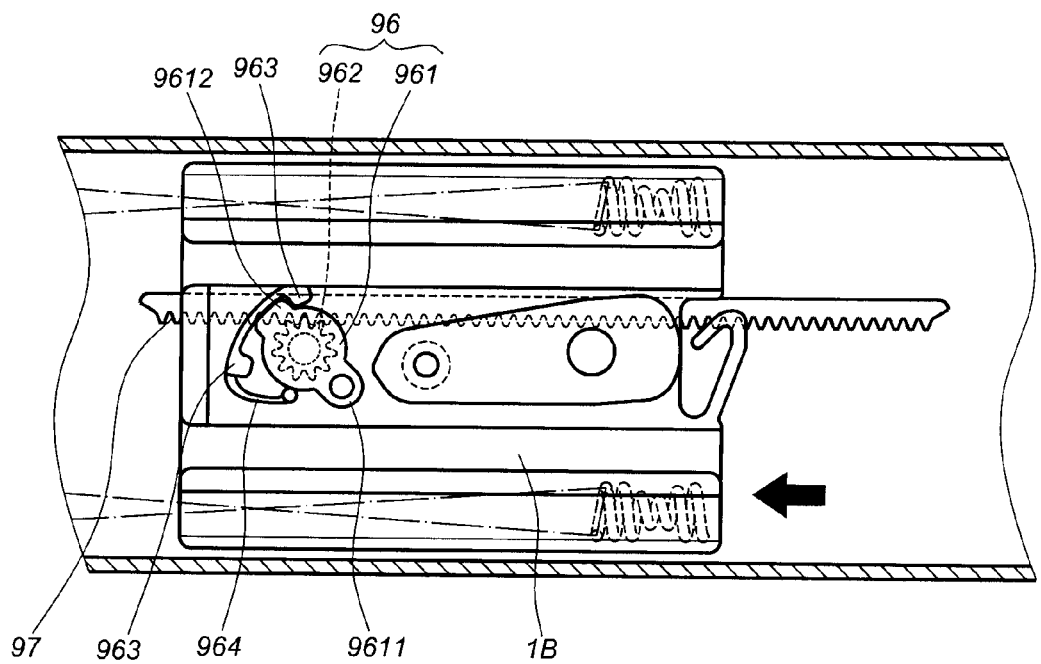
FIG. 23 is a side cross-sectional view of the first preferred embodiment of the present invention showing that the damper engages with the gear chain.

As shown in FIGS. 22 and 23, the case 961 of the damper 96 has a connecting end 9611 and an active end 9612. The connecting end 9611 is pivotally connected to the sliding member 1B. The sliding member 1B comprises a restricting member 963 corresponding to the active end 9612 of the case 961 to confine swinging angle of the damper 96. The sliding member 1B further comprises a resilient element 964 corresponding to the damper 96, providing a friction against the gear 962. As shown in FIG. 22, the swing of the damper 96 presses the resilient element 964 to urge the gear 962 detaching from the gear chain 97. When the sliding member 1B returns to its original position, the damper 96 will swing back to its original position where the gear chain 97 meshes with the gear 962, these engagement and disengagement release the friction of the damper 96 when the sliding member 1B is pulled outwardly.

Figure 24:
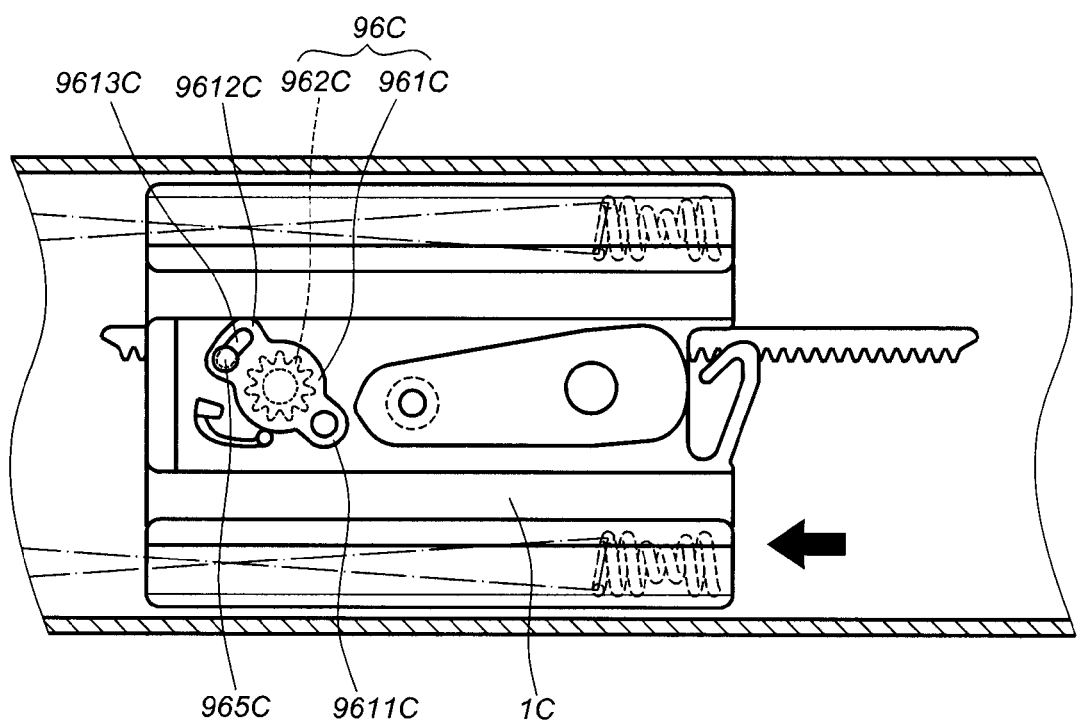
FIG. 24 is a side-cross-sectional view of a damper of a fourth preferred embodiment of the present invention.

Another embodiment of the damper, as shown in FIG. 24, provides a different swing angle of a damper 96C. The damper 96C comprises a case 961C and a gear 962C. The case 961C of the damper 96 has a connecting end 9611C and an active end 9612C. An arc trough 9613C is formed at the active end 9612C corresponding to the connecting end 9611C. A pin 965C penetrating through the arc slot 9613C is secured to a sliding member 1C.

Figure 25:
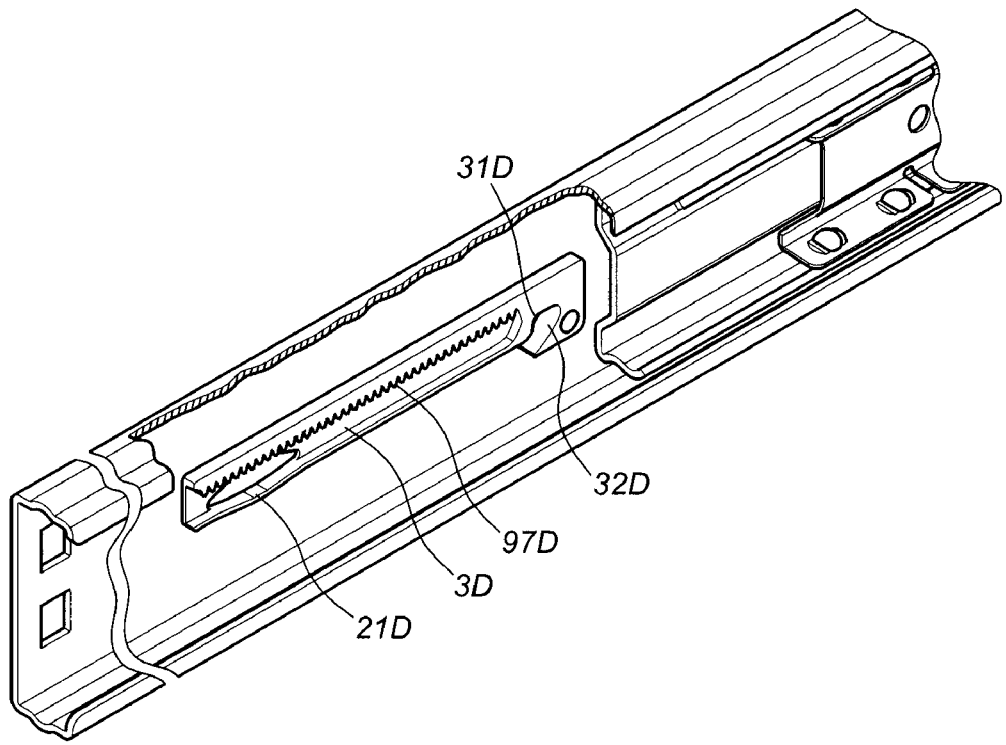
FIG. 25 is a perspective view of a retainer of a fifth preferred embodiment of the present invention (the guiding rail comprises a gear chain, a recess, a second inclined plane, and a second resilient member)

As shown in FIG. 25, a gear chain 97D may be formed on a retainer 3D. The retainer 3D comprises a recess 31D, a second inclined plane 32D adjacent to the recess 31D, and a second resilient member 21D.

Figure 26:
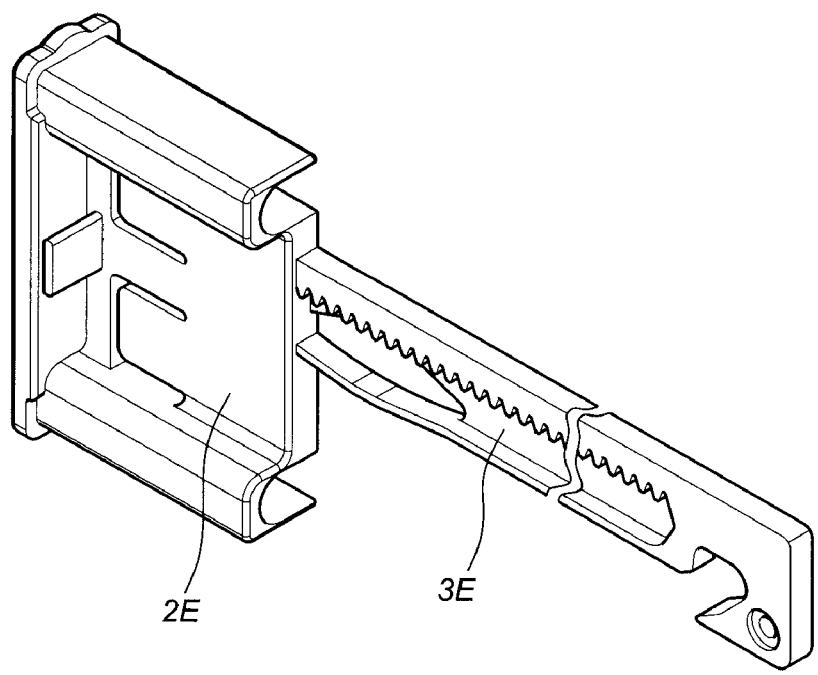
FIG. 26 is a perspective view of a sixth preferred embodiment of the present invention showing that a retainer is integrally formed with a fixing base.

As shown in FIG. 26, a retainer 3E is integrally formed with a fixing base 2E.

As shown in FIG. 27, the engaging rod 83 of the engaging plate 8 is urged by the second resilient member 21' when the sliding rail 6 is in a first predetermined position with respect to the stationary rail 5.

As mentioned above, the engaging rod 83 of the engaging plate 8 will detach from the second resilient member 21' when the sliding rail 6 moves from the first predetermined position to a second predetermined position with respect to the stationary rail 5. When the sliding rail 6 moves to the second predetermined position relative to the stationary rail 5, the first inclined plane 41 of the guiding member 4 will engage with the engaging rod 83. This engagement will urge the engaging rod 83 to detach from the recess 31 of the retainer 3 and then to engage with the protuberance 42 of the guiding member 4. The sliding member 1 is detached from the retainer 3 and the sliding rail 6 is urged by the first resilient members 11 to retreat back into the stationary rail 5.

Figure 28:
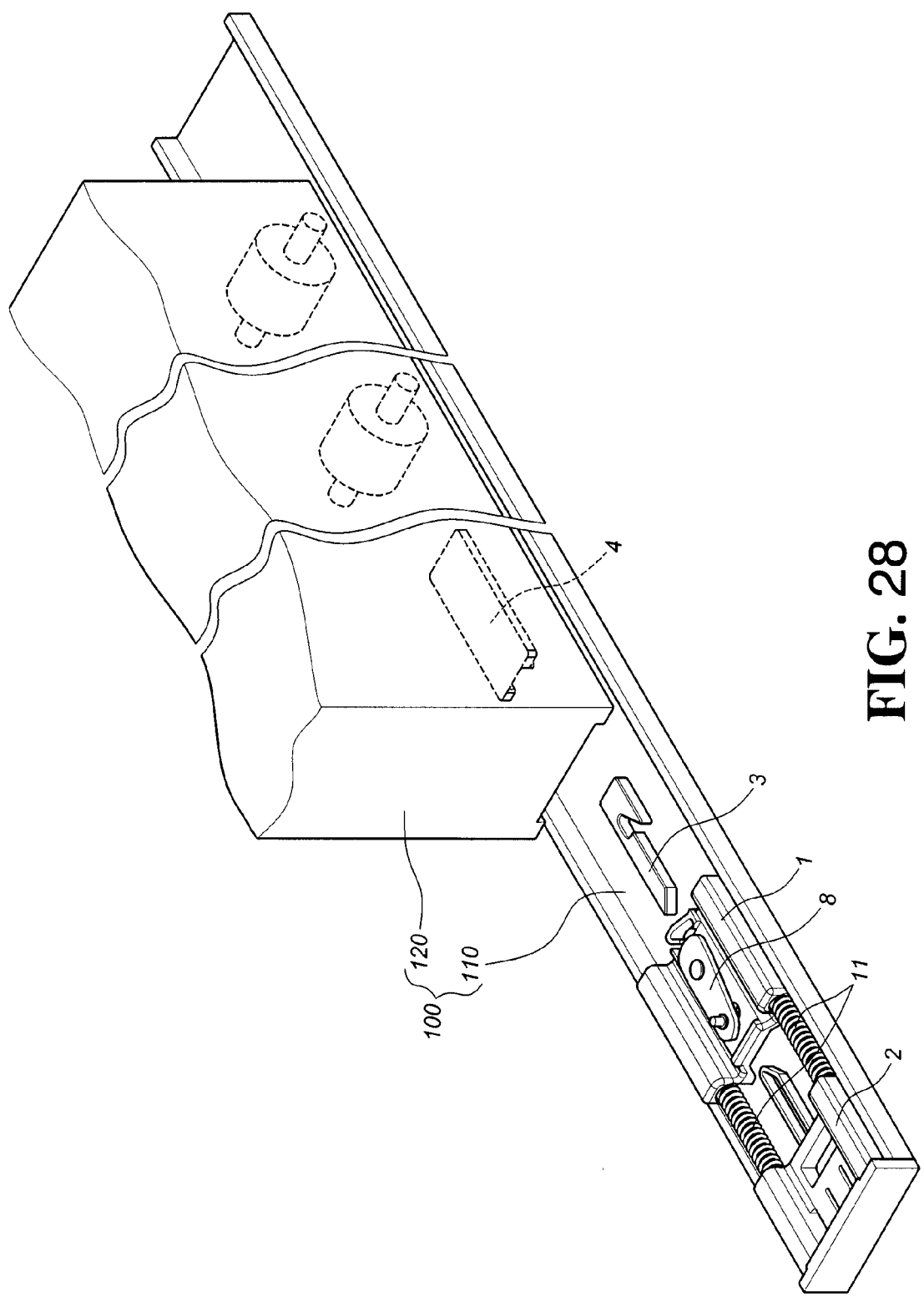
FIG. 28 is a cross-sectional view of a seventh preferred embodiment of the present invention applied to a furniture assembly.

Referring to FIG. 28, it shows another preferred embodiment of the present invention applied to a furniture assembly 100. The furniture assembly 100 includes a stationary member 110 and a movable member 120 moveable with respect to the stationary member 110. The stationary member 110 is similar to the connection of the stationary rail 5. The movable member 120 is similar to the connection of the sliding rail 6.

Preferably, the stationary member 110 is a furniture body such as a door rail, a door frame, or the like. Preferably, the movable member 120 is slidably connected to the stationary member 110. In a preferred embodiment of the present invention, the movable member 120 is disposed corresponding in position to the stationary member 110, and the movable member 120 may be a door, a window, or the like.

What is claimed is:

1. A slide assembly comprising:
   a stationary rail having a rail trough;
   a sliding rail slidably connected to said stationary rail, the sliding rail including a guiding member having a first inclined plane and a protuberance;
   a sliding member slidably disposed in said rail trough of said stationary rail;
   a fixing base secured at one end of said stationary rail;
   a first resilient member connected between said sliding member and said fixing base;
   a retainer disposed in said stationary rail, said retainer including a recess and a second inclined plane adjacent to said recess;
   a second resilient member fixed relative to said stationary rail; and
   an engaging plate movably connected to said sliding member, said engaging plate including an engaging rod corresponding in position to said second resilient member;
   wherein said engaging rod of said engaging plate is urged by said second resilient member to engage said protuberance of said guiding member when said sliding rail is in a first predetermined position with respect to said stationary rail;
   wherein said engaging rod of said engaging plate detaches from said second resilient member and moves along said second inclined plane of said retainer into said recess of said retainer when said sliding rail moves from said first predetermined position to a second predetermined position with respect to said stationary rail, said engaging rod having thereby disengaged from said protuberance of said guiding member;
   wherein said first inclined plane of said guiding member engages said engaging rod and urges said engaging rod to disengage from said recess of said retainer to engage said protuberance of said guiding member when said sliding rail moves from said second predetermined position toward said first predetermined position relative to said stationary rail, so that said sliding rail is urged by said first resilient members to retreat back into said stationary rail.

2. The slide assembly according to claim 1, wherein said engaging plate has a first end pivotally connected to said sliding member and a free second end displaced therefrom, said engaging rod being disposed on said second end of said engaging plate.

3. The slide assembly according to claim 1, wherein said second resilient member is integrally formed with said retainer.

4. The slide assembly according to claim 3, wherein said second resilient member is a resilient rod.

5. An automatic retractable device for a furniture assembly, the furniture assembly including a stationary member and a movable member movable with respect to the stationary member, the device comprising:
   a guiding member connected with said movable member, said guiding member having a first inclined plane and a protuberance;
   a sliding member slidably connected to said stationary member;
   a fixing base secured on said stationary member;
   a first resilient member connected between said sliding member and said fixing base;
   a retainer disposed in said stationary member, said retainer including a recess and a second inclined plane adjacent to said recess;
   a second resilient member fixed relative to said stationary member; and
   an engaging plate movably connected to said sliding member, said engaging plate including an engaging rod corresponding in position to said second resilient member;
   wherein said engaging rod of said engaging plate is urged by said second resilient member to engages said protuberance of said guiding member when said movable member is in a first predetermined position with respect to said stationary member;
   wherein said engaging rod of said engaging plate detaches from said second resilient member and moves along said second inclined plane of said retainer into said recess of said retainer when said movable member moves from said first predetermined position to a second predetermined position with respect to said stationary member, said engaging rod having thereby disengaged from said protuberance of said guiding member;
   wherein said first inclined plane of said guiding member engages said engaging rod and urges said engaging rod to disengage from said recess of said retainer to engage said protuberance of said guiding member when said movable member moves from said second predetermined position toward said first predetermined position relative to said stationary rail, so that said movable member is urged by said first resilient members to retreat back into said stationary member.

6. The device according to claim 5, wherein said engaging plate has a first end pivotally connected to said sliding member and a free second end displaced therefrom, said engaging rod being disposed on said second end of said engaging plate.

7. The device according to claim 5, wherein said second resilient member is integrally formed with said retainer.

8. The device according to claim 7, wherein said second resilient member is a resilient rod.

9. An automatic retractable device comprising:
   a fixing base;
   a sliding member movable with respect to the fixing base;
   a guiding member movable with respect to the sliding member, the guiding member having a first inclined plane and a protuberance;
   a first resilient member connected between said sliding member and said fixing base;
   a retainer comprising a recess and a second inclined plane adjacent to said recess;
   a second resilient member fixed relative to the fixing base; and
   an engaging plate movably connected to the sliding member, the engaging plate comprising an engaging rod corresponding in position to the protuberance of the guiding member and the second resilient member;
   wherein the engaging rod of the engaging plate is urged by the second resilient member to engages the protuberance of the guiding member when the sliding member is in a first predetermined position with respect to the fixing base;
   wherein the engaging rod of the engaging plate detaches from the second resilient member and moves along the second inclined plane of the retainer into the recess of the retainer when the sliding member moves from the first predetermined position to a second predetermined position with respect to the fixing base, the engaging rod having thereby disengaged from the protuberance of the guiding member;

wherein the first inclined plane of the guiding member engages the engaging rod and urges the engaging rod to disengage from the recess of the retainer to engage the protuberance of the guiding member when the sliding member moves from the second predetermined position toward the first predetermined position relative to the fixing base, so that the sliding member is urged by the first resilient members to retreat back into the fixing base.

* * * * *